(12) United States Patent
Mitamura

(10) Patent No.: US 6,222,114 B1
(45) Date of Patent: Apr. 24, 2001

(54) PORTABLE WRIST DEVICE

(75) Inventor: Gen Mitamura, Chiba (JP)

(73) Assignee: Seiko Instruments Inc. (JP)

( * ) Notice: Subject to any disclaimer, the term of this patent is extended or adjusted under 35 U.S.C. 154(b) by 0 days.

(21) Appl. No.: 09/403,182

(22) PCT Filed: Feb. 22, 1999

(86) PCT No.: PCT/JP99/00782

§ 371 Date: Jan. 19, 2000

§ 102(e) Date: Jan. 19, 2000

(87) PCT Pub. No.: WO99/42910

PCT Pub. Date: Aug. 26, 1999

(30) Foreign Application Priority Data

Feb. 20, 1998 (JP) ................................................ 10-039412

(51) Int. Cl.[7] ................................................ H01L 35/02
(52) U.S. Cl. .................. 136/242; 136/205; 368/203; 368/281; 368/285; 368/286
(58) Field of Search ................... 136/242, 205; 368/203, 276, 283, 281, 282, 285, 286, 294, 295, 309

(56) References Cited

FOREIGN PATENT DOCUMENTS

| | | | |
|---|---|---|---|
| 2020863 | * | 9/1982 | (GB) . |
| 55-20483 | * | 2/1980 | (JP) . |
| 55-206997 | * | 12/1983 | (JP) . |
| 6-109868 | * | 4/1994 | (JP) . |
| 8-36071 | * | 2/1996 | (JP) . |

OTHER PUBLICATIONS

Microthermoelectric modules and their applicatio to wristwatches as an energy source, Kishi, M.; Nemoto, H.; Hamao, T.; Yamamoto, M.; Sudou, S.; Mandai, M.; Ya, S.; Thermoelectrics, 1999. Eighteenth International Cnference, Aug. 29–Sep. 2, 1999.*

* cited by examiner

Primary Examiner—Kathryn Gorgos
Assistant Examiner—Thomas H Parsons
(74) Attorney, Agent, or Firm—Adams & Wilks

(57) ABSTRACT

A wrist-portable device improves the radiation efficiency of the radiation section of a thermoelectric generator and minimizes a temperature difference between the radiation section and the outside air. In order to prevent a radiation section of a thermoelectrically powered watch from increasing its temperature due to a hand or a high-temperature substance unexpectedly touching the surface of the radiation section, the surface of the radiation section is detachably covered with a radiation guard cover having meshes or striped holes formed therein.

28 Claims, 8 Drawing Sheets

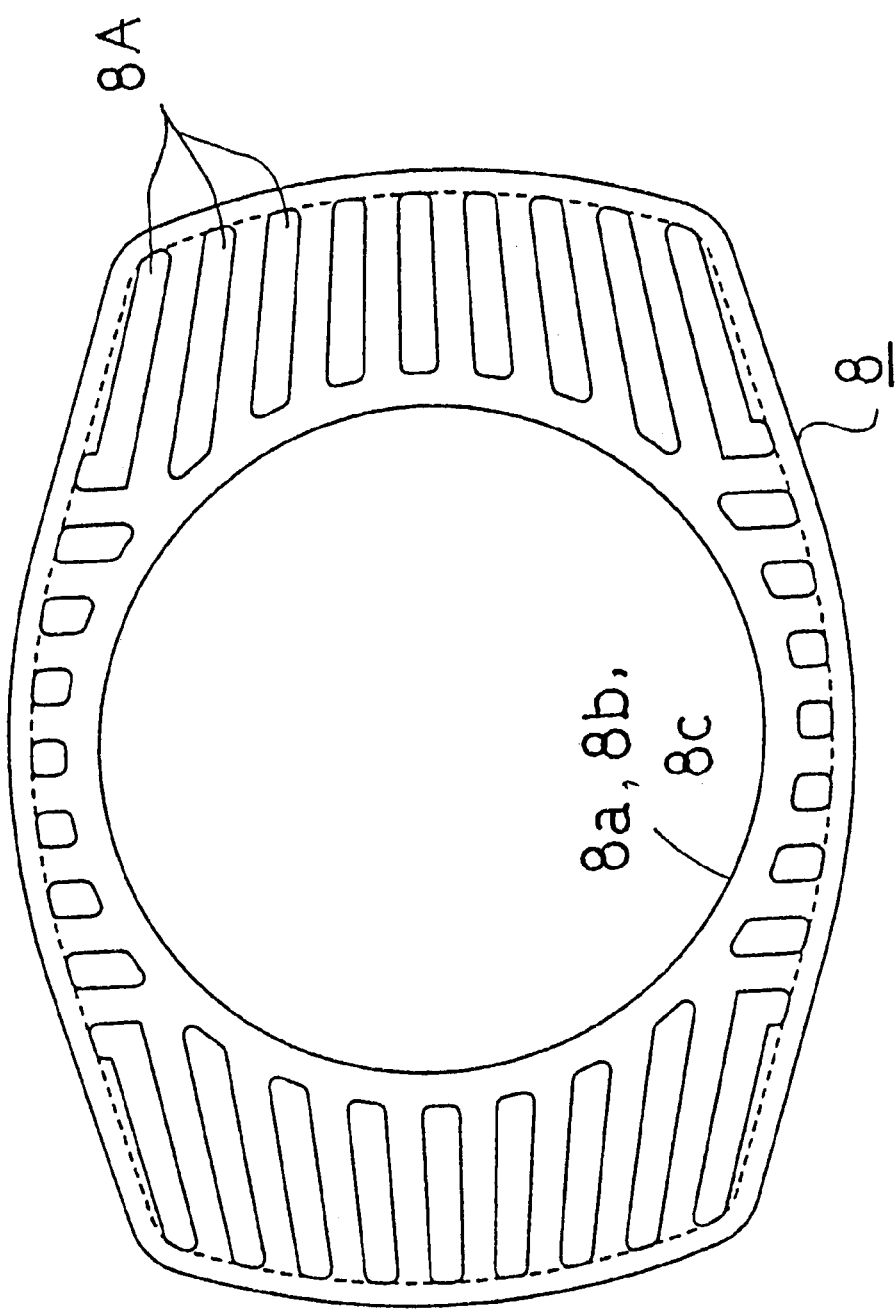

PORTABLE WRIST DEVICE

BACKGROUND OF THE INVENTION

1. Field of the Invention

The present invention relates to a wrist-portable device having a thermoelectric power generator, such as a wrist watch.

2. Description of the Related Art

Of all wrist-portable devices such as wrist watches, electronic wrist watches are now the leading commodity, and most electronic wrist watches are powered by a silver oxide battery or a lithium battery.

However, these batteries are consumable supplies, and hence they need to be replaced periodically. In addition, the use of natural batteries leads to the consumption of limited natural resources and brings about environmental pollution when they are discarded.

To overcome these problems, wrist watches incorporating a power generation mechanism have been studied to replace battery-powered watches.

Known power generation mechanisms include a solar battery, a mechanical power generation mechanism and a thermoelectric power generation mechanism. The solar battery absorbs and converts the radiant energy of sunlight into electrical energy. The mechanical power generation mechanism utilizes gravitational energy. The thermoelectric power generation mechanism utilizes the Seebeck effect (the Peltier effect) based on a temperature difference. Of those mechanisms, watches powered by the solar battery and mechanical power generation have already been put in practical use.

On the other hand, the thermoelectric power generation mechanism is not yet commercially available although its principle has been known, as disclosed in Japanese Examined Patent Publication No. Hei 2-13279. It is still under study for practical use.

When thermoelectric power generation is utilized in a wrist-portable device, there is utilized a difference between the body temperature transferred to the wrist-portable device through the wrist (the high-temperature section) and the temperature of the air around the wrist-portable device (the low-temperature section).

However, the wrist-portable devices so far available have had problems of heat transfer from the high-temperature section to the heat receiving section of the thermoelectric generator and heat transfer from the radiation section of the thermoelectric generator to the low-temperature section, and these problems have prevented obtaining a temperature difference large enough to generate electric energy required for the thermoelectric generator.

The efficiency of radiation from the wrist-portable device to the outside air (low-temperature section) in particular fluctuates greatly, depending on how the wrist-portable device is worn or the like. For example, if part of the body is in contact with the radiation side of the wrist-portable device, the radiation section of the device does not radiate heat at all, and what is worse is that the radiation section absorbs heat, which is contrary to its purpose. Such problems may easily arise.

SUMMARY OF THE INVENTION

The present invention has been made to overcome the aforementioned problems. An object of the invention is therefore to provide a wrist-portable device with its power generation efficiency increased by eliminating the undesirable infiltration of heat from the radiation section of the thermoelectric generator.

To overcome the aforementioned problems, the following considerations have been given. Success of thermoelectric generation resides on how much heat can be absorbed and how well heat is radiated. When a wrist-portable device is worn, heat is absorbed not necessarily from the back cover but also from the glass, the bezel, the case bands and the like that should serve as a heat sink, due to heat contact or radiation.

According to the present invention, a guard for preventing undesirable heat contact is provided so as to prevent reverse infiltration of heat from the radiation section.

There is provided a wrist-portable device including a heat receiving section and a heat radiating section, and having a thermoelectric generator for generating predetermined electric energy taking advantage of a temperature difference between the heat receiving section and the heat radiating section, comprising:

an inner case band having a hollow portion vertically passing through the inner case band and being made of a material having a low heat conductivity;

a back cover for covering a lower end side of the hollow portion;

a glass for covering an upper end side of the hollow portion;

a bezel for holding a rim of the glass;

a radiation outer case band arranged on an upper surface of the inner case band, either fitted with the bezel so that heat can be transferred to the bezel or unitized with the bezel, and made of a material having a high heat conductivity; and a radiation guard cover for covering a surface of at least one of the glass, the bezel and the radiation outer case band, the cover having a plurality of radiation holes and made of a material having a low heat conductivity.

According to this invention, the heat from the wrist is transferred to the heat receiving section of the thermoelectric generator through the back cover to thereby generate power, and is thereafter transferred to the glass, the bezel and the outer case band integrated with the bezel.

The transferred heat is radiated into the air from the outer surfaces of the glass, the bezel and the outer case band integrated with the bezel.

However, if a human body or a heat source should touch the bezel and the outer case band accidently, the radiating function is not performed in the conventional device, and what is worse is that heat is absorbed to stop power generation. The present invention employs a radiation guard cover for preventing accidental heat contact.

The heat from the radiation section is radiated into the outside air via meshes, striped slits or radiation holes formed in the radiation guard cover.

Therefore, even if a hand or the like touches the radiation section of the wrist-portable device accidently, the radiation section of the thermoelectric generator still can remove heat away from the generator, thereby allowing power generation to be maintained.

Here, the wrist-portable device includes electronic devices, such as wrist watches and pagers.

For example, plastics having a heat conductivity of 1 W/(m.° C.) or lower are the best low-heat-conductivity materials for the inner case band. However, if mechanical strength is an important factor, metals such as stainless steels and Ti having a heat conductivity of around 20 W/(m.° C.)

can also be used as long as other conditions, such as the performance of the generator and the heat radiating performance of the radiation outer case band, are acceptable.

Further, metals such as Au, Ag, Cu and Al whose heat conductivity is as high as around 200 to 400 W/(m.° C.) are the best high-heat-conductivity materials for the radiation outer case band. However, copper alloys, etc., such as Bs whose heat conductivity is 100 W/(m.° C.) or higher can also be used as long as other conditions are acceptable.

Still further, in the present invention, the radiation cover is a plate having meshes or a plurality of holes which are shaped by straight lines or curved lines arranged in a decorative form.

According to this invention, if the radiation holes of the radiation guard cover are arranged effectively, the cover can radiate heat from the meshes or the radiation holes, and its portion other than these holes can prevent a hand or the like from directly touching the radiation section. In addition, an ornamental cover can be made, depending on how the meshes or the holes are arranged.

Here, plastics, e.g., whose heat conductivity is 1 W/(m.° C.) or lower are the best materials for the radiation guard cover. Particularly, high-strength resins such as urethane rubbers and polycarbonates are suitable.

If mechanical strength is an important factor, sheets and nets made of metals having relatively low heat conductivity, such as stainless steels and Ti whose heat conductivity is around 20 W/(m.° C.), may also be used.

Further, according to the present invention, the area totaling the surface areas passing the meshes or the holes therethrough is 50% or more of the surface area of a radiation guard section on the radiation guard cover.

Generally, the larger the meshes, the better. However, the rough meshes weaken the mechanical strength of the guard cover. Therefore, in the present invention, mechanical strength is secured by devising the strength, shapes or materials of the meshes in their thickness direction with respect to the size of the meshes in their plane direction.

Here, materials having a low heat conductivity, such as heat insulating materials and resin materials are generally the best materials for the guard cover. However, implementing good heat insulation, the present invention enables the use of metals having high mechanical strength as the materials for the guard cover.

Further, in the present invention, a predetermined space is provided between the radiation guard cover and the radiation section.

The guard is formed with radiation holes.

According to the present invention, the predetermined space is provided between the radiation guard cover and the radiation section. Thus, the radiation guard cover can prevent heat transfer caused by unexpected touching by a heat source such as a hand, so that the transfer of heat from such a heat source to the radiation section can be reduced.

Further, since the space is formed, the entire surface of the radiation section is exposed to the air although its radiation holes are small, and this contributes to a smaller reduction in the radiation efficiency.

Here, materials having a low heat conductivity, such as heat insulating materials and resin materials, are the best materials for the guard cover. However, since the air which is a heat insulating material is present between the radiation guard cover and the radiation section, metals generally having high heat conductivity can also be used.

According to this invention, the radiation guard cover is detachably fitted with the bezel or with the outer case band. Thus, when the bezel or the outer case band becomes stained, the bezel or the outer case band can be easily removed and cleaned.

Further, the user can enjoy changing the radiation guard cover with another type to his taste as a decorative accessory.

DETAILED DESCRIPTION OF THE DRAWINGS

Wrist-portable devices, which are embodiments of the present invention, will now be described with reference to FIGS. 1 to 5.

Figure 1:
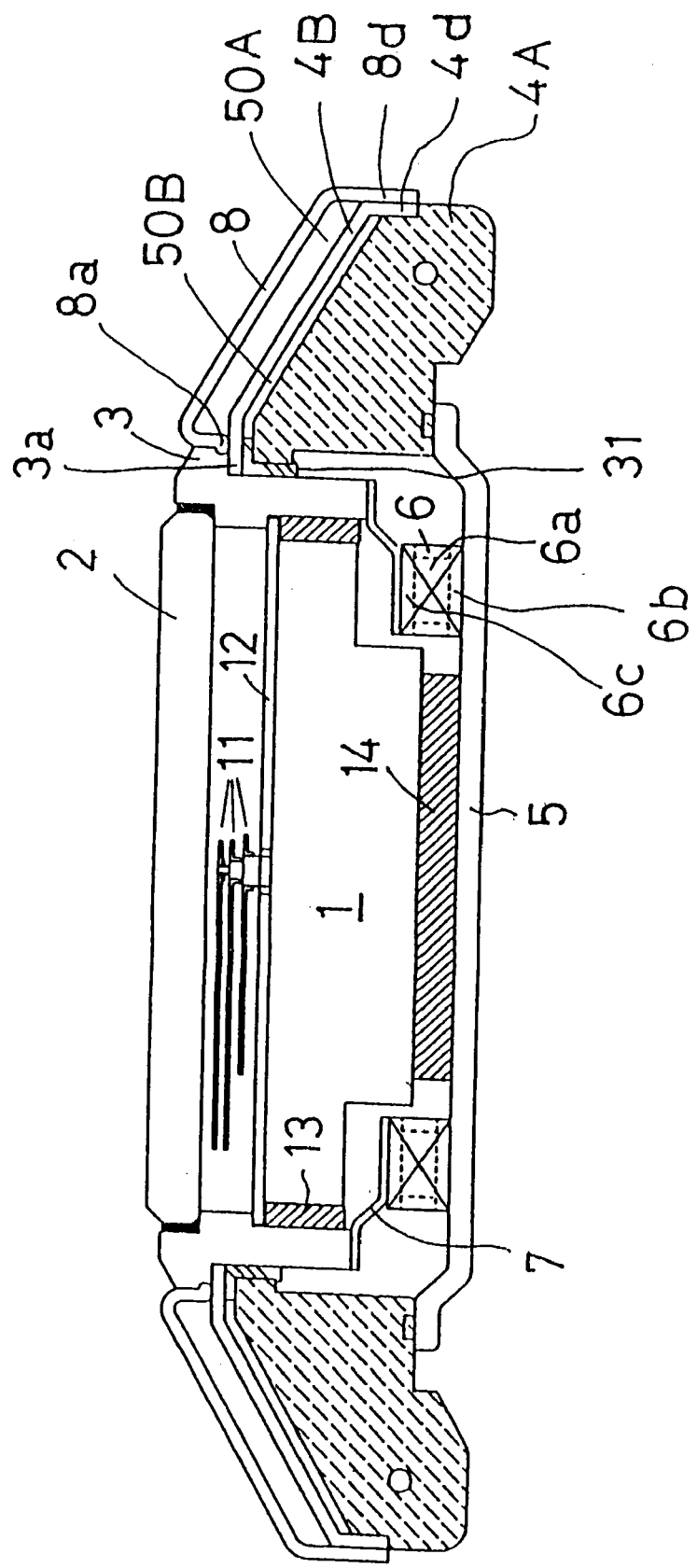
FIG. 1 is a sectional view of an exemplary wrist watch, which is a first embodiment of a wrist-portable device of the present invention.
Figure 3:
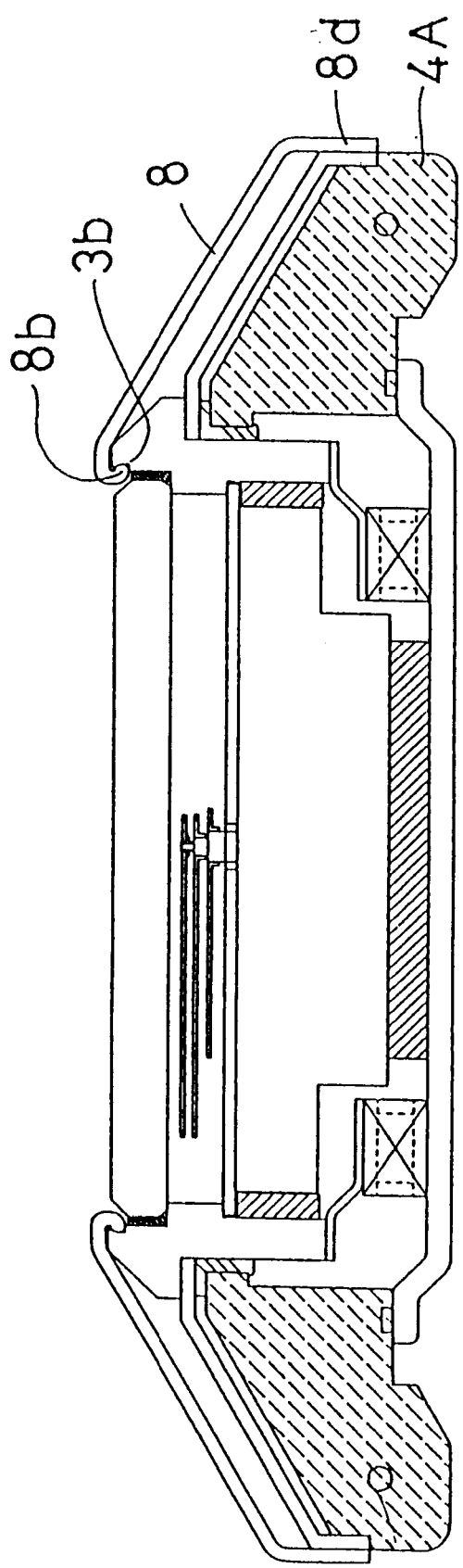
FIG. 3 is a sectional view of a modified example of the wrist watch shown in FIG. 1.
Figure 4:
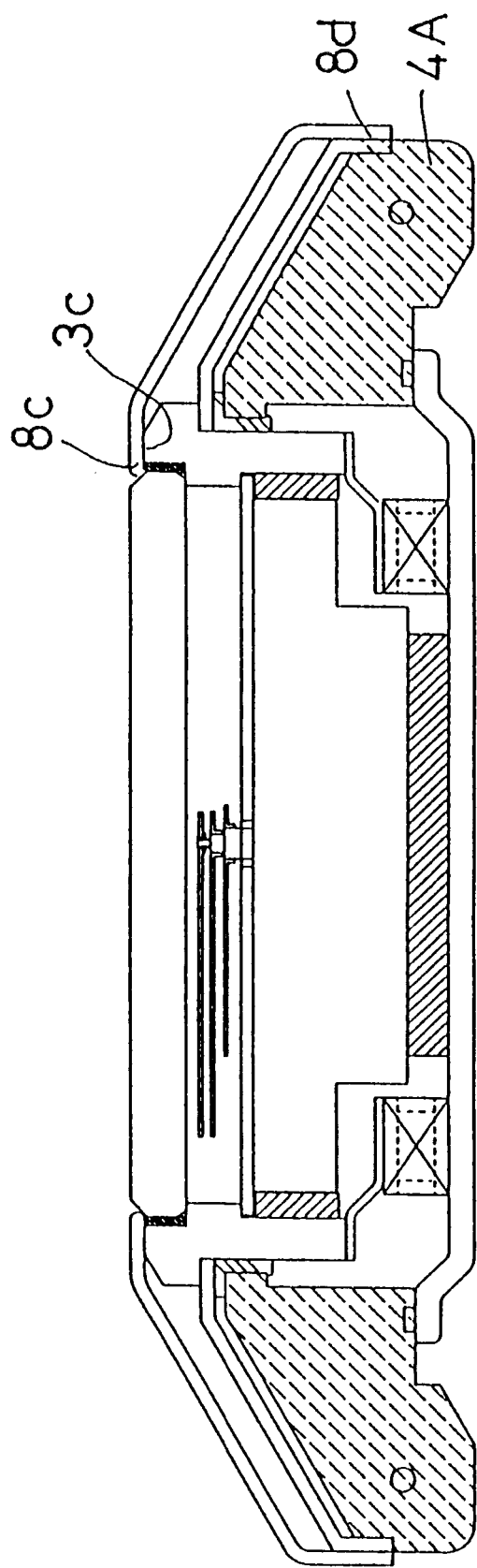
FIG. 4 is a sectional view of the modified example of the wrist watch shown in FIG. 1.

FIG. 1 is a sectional view of an exemplary wrist watch, which is a first embodiment of the wrist-portable device of the present invention; FIGS. 2(a) and (b) are a plan view and a side view of a radiation guard cover; and FIGS. 3 and 4 are sectional views of modified examples of the wrist watch shown in FIG. 1.

In FIGS. 1 to 4, reference numeral 1 denotes a movement; 2, a glass; 4A, an inner case band; 4B, a radiation outer case band; 5, a back cover; 6, a thermoelectric generator; 7, a heat conducting plate; 8, a radiation guard cover; 11, hands; 12, a dial face; 13 and 14, inner frames; and 50A and 50B, spaces.

The thermoelectric generator 6 includes a plurality (e.g., 10) of thermoelectrically generating elements 6a, and an annular heat radiating plate 6c and an annular heat receiving plate 6b. Both plates 6c and 6b interpose the elements 6a therebetween.

The thermoelectric generator 6 generates predetermined electric energy by means of the Seebeck effect, while utilizing a temperature difference between the heat receiving plate 6b (high-temperature section) and the heat radiating plate 6c (low-temperature section).

The thermoelectric generator 6 is constructed in such a manner that the side end face of its heat receiving plate 6b is fixed to the back cover 5 and that the-side end face of its heat radiating plate 6c is fixed to the heat conducting plate 7 (made of, e.g., Cu).

The inner case band 4A has an accommodating space (hollow portion) for accommodating the movement 1, the thermoelectric generator 6 and the like therein. The space 4c passes through the case band 4A vertically.

The inner case band 4A is made of a metal having a low heat conductivity, such as a ceramic material, a plastic, a stainless steel, or a metal such as SUS or Ti.

For example, plastics whose heat conductivity is 1 w/(m.° C.) or lower are the best low-heat-conductivity materials for the inner case band.

However, if mechanical strength is an important factor, metals such as stainless steels and Ti whose heat conductivity is around 20 W/(m.° C.) can also be used, as long as other conditions, such as the performance of the generator and the radiating performance of the radiation outer case band, are acceptable.

The glass 2 is made of, e.g., sapphire glass, heat absorbing glass or the like having good heat conductivity, and is shaped substantially like a disk. The rim of the glass 2 is fixed to a bezel 3.

The back cover 5 is made of a metal such as Ti or a stainless steel, and is shaped like a disk. The rim of the cover 5 is fixed to the bottom surface of the inner case band 4A. The inner surface (the surface on the side of the movement 1) of the back cover 5 is Cu-plated (or clad with a Cu sheet) in order to improve its heat conductivity.

On the upper surface of the inner case band 4A, the radiation outer case band 4B having a higher heat conductivity is fitted with the bezel 3 so that the case band 4B can transfer heat to the bezel 3. That is, the outer case band 4B is attached to the bezel 3 so as to cover the upper surface of the inner case band 4A.

The radiation outer case band 4B is made of a metal such as Au, Ag, Cu or Al whose heat conductivity is as high as around 200 to 400 W/(m.° C.). The radiation outer case band 4B has an opening 4Ba in the middle thereof. The opening 4Ba allows the upper end faces of the glass 2 and the bezel 3 to be exposed.

The side end face of the opening of the radiation outer case band 4B is in intimate contact with the outer circumferential surface of the bezel 3, and hence the outer case band 4B is fitted with the bezel 3 in such a manner that the case band 4B can transfer heat to the bezel 3.

The radiation outer case band 4B is attached to the upper surface of the inner case band 4A while interposing a space 50B therebetween, so that the transfer of heat between both case bands 4B and 4A can be prevented. Note that a heat insulating material may be sealed in the space 50B.

Further, the radiation outer case band 4B is fixed to the upper end portion of the inner case band 4A through a packing 31 so that the case band 4B is insulated from the case band 4A. The case band 4B is also interposed between the inner case band 4A and the bezel 3. The outer circumferential lower end portion 4d of the outer case band 4B is engaged with the outer circumferential upper end portion of the inner case band 4A.

Above the radiation outer case band 4B is the radiation guard cover 8. The radiation guard cover 8 is mounted so as to cover the entire outer case band 4B, and hence the outer case band 4B is prevented from being touched by, e.g., a hand.

FIG. 2 shows an example of the radiation guard cover 8. FIG. 2(a) is a plan view of the radiation guard cover 8. The radiation guard cover 8 is formed so as to cover the entire radiation outer case band 4B. Meshes or many decoratively arranged through holes 8A are provided in the surface of the cover 8.

In order to radiate heat from the radiation outer case band into the atmosphere, it is preferable to give the through holes as large surface areas as possible. It is desirable to give the through holes an area totaling at least 50% or more of the whole area of the cover 8.

Figure 2B:
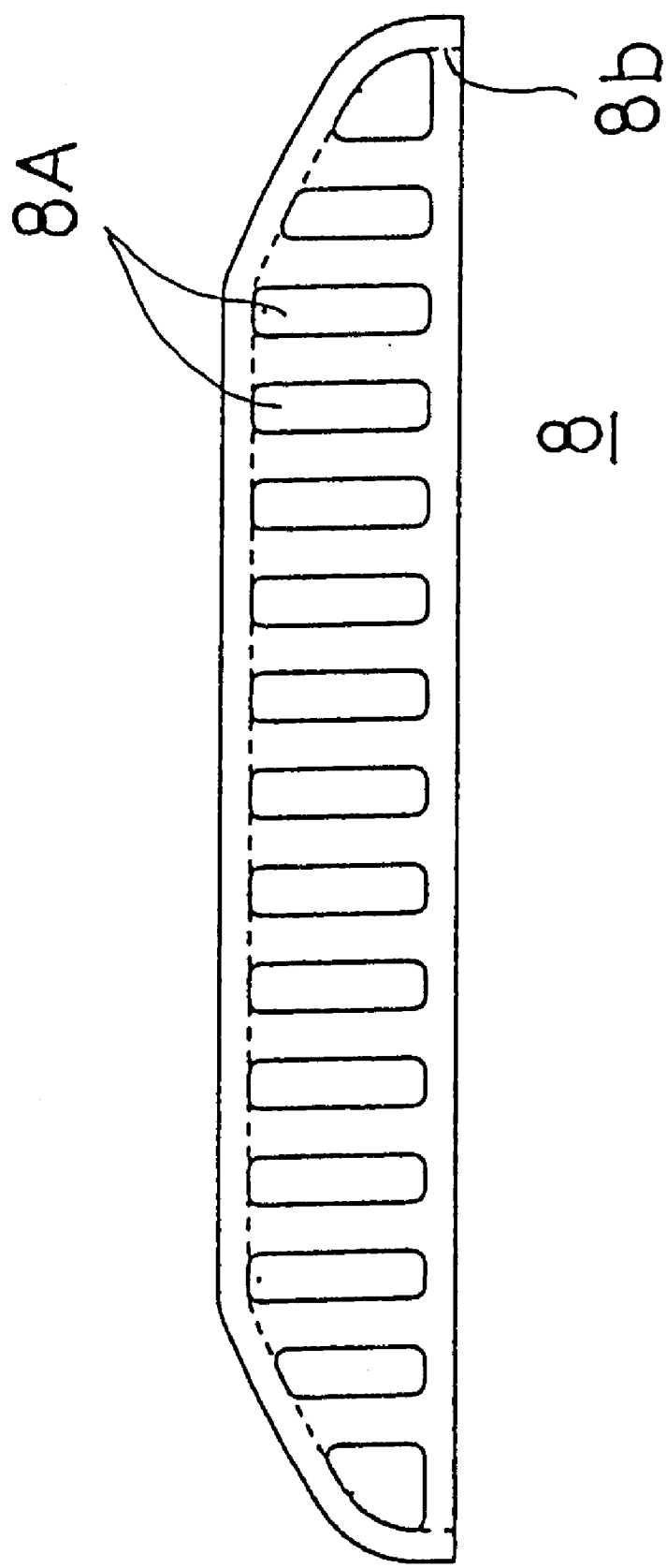
FIGS. 2(a) and (b) are a plan view and a side view of a radiation guard cover.

FIG. 2(b) is a side view of the radiation guard cover 8. The radiation guard cover 8 has, on its outer circumferential end, an engaging portion for engaging with the inner case band 4A or the radiation outer case band. On the other hand, the cover 8 also has, on the inner circumference of its upper end, an engaging portion for engaging with the bezel 3 or a bezel equivalent 43 (shown in FIGS. 5(a) to (c)).

Plastics whose heat conductivity is 1 W/(m.° C.) or lower are the best materials for the guard cover. However, if mechanical strength is an important factor, metals such as stainless steels and Ti whose heat conductivity is around 20 W/(m.° C.) can also be used.

The radiation guard cover 8 interposes the space 50A between the radiation outer case band 4B and itself, thereby preventing heat from being transferred between the outer case band 4B and itself and hence allowing the heat to be radiated from the outer case band 4B.

The radiation guard cover 8 is detachably attached to the wrist watch in such a manner that the lower end cylindrical portion 8d of the cover 8 is fitted around the inner case band 4A, that its inner circumferential projecting portion 8a is fitted with the radiation outer case band 4B or the inner case band 4A, and that its inner circumferential projecting portion 8b is fitted into a cutaway portion 3a formed in the upper end of the bezel.

Note that the radiation guard can be constructed, e.g., as shown in FIGS. 3 and 4.

In FIGS. 3 and 4, the radiation guard cover 8 covers not only the radiation outer case band 4B but the upper end face of the bezel 3 as well.

In the example shown in FIG. 3, the radiation guard cover 8 is detachably attached to the wrist watch in such a manner that the lower end cylindrical portion 8d thereof is fitted around the radiation outer case band 4B or the inner case band 4A, and that its inner circumferential projecting portion 8b is fitted into a cutaway portion 3b of the upper end of the bezel.

Further, in the example shown in FIG. 4, the radiation guard cover 8 is detachably attached to the wrist watch in such a manner that the lower end cylindrical portion 8d of the cover 8 is fitted around the radiation outer case band 4B or the inner case band 4A, and that its inner circumferential end portion 8c is in intimate contact with the upper end face 3c of the bezel.

FIG. 5 shows sectional views of exemplary wrist watches, which illustrate a second embodiment of the wrist-portable device of the present invention.

Figure 5A:
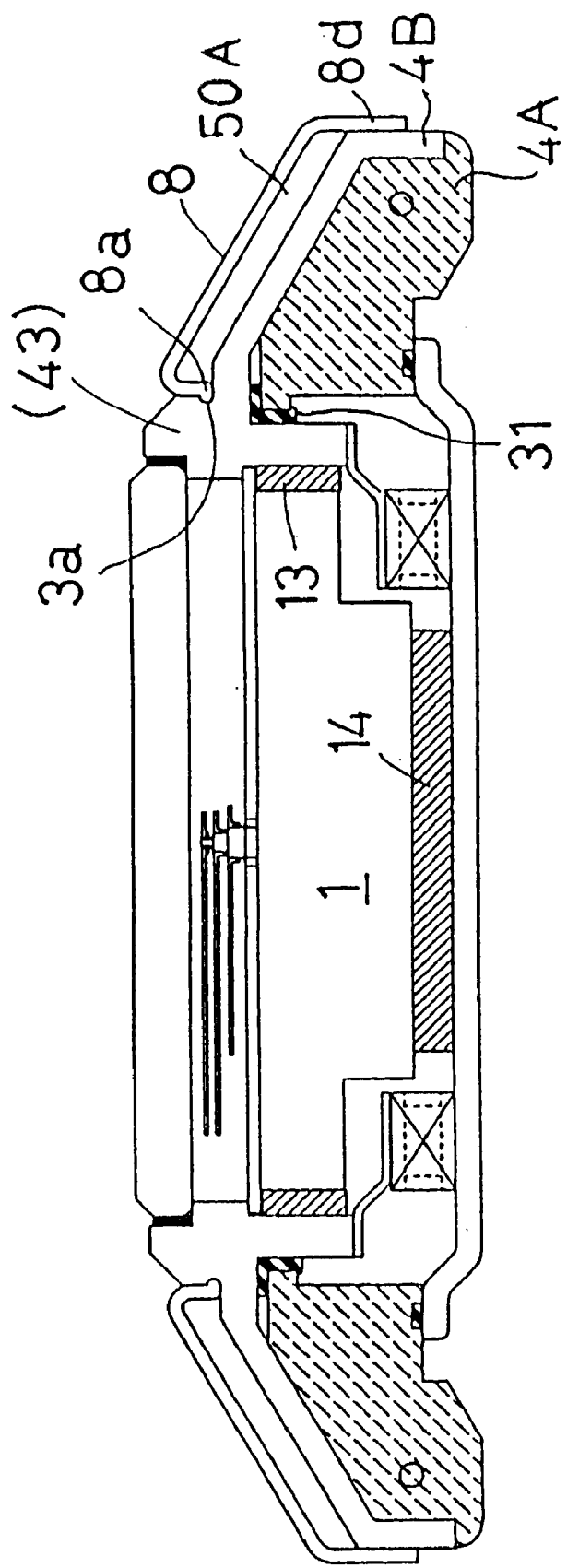
FIGS. 5(a) to (c) are sectional views of exemplary wrist watches, which illustrate a second embodiment of the wrist-portable device of the present invention.
Figure 5B:
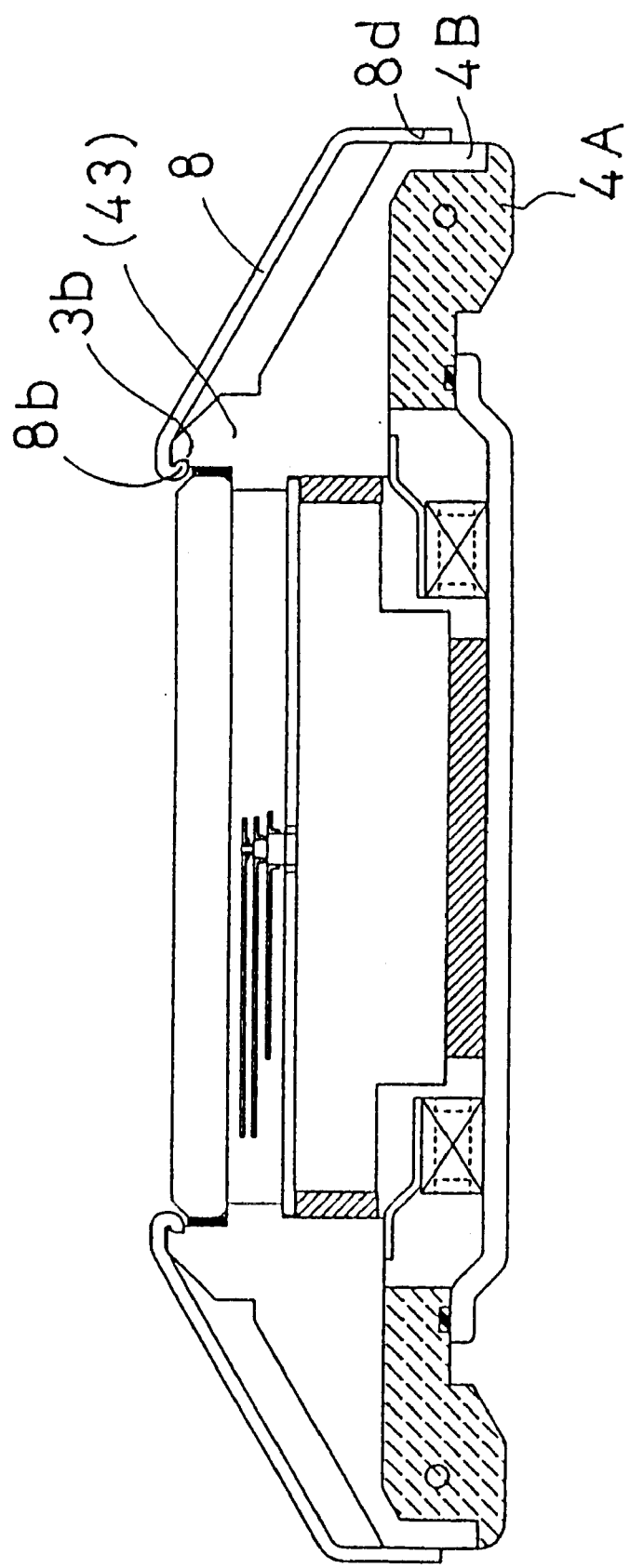
Figure 5C:
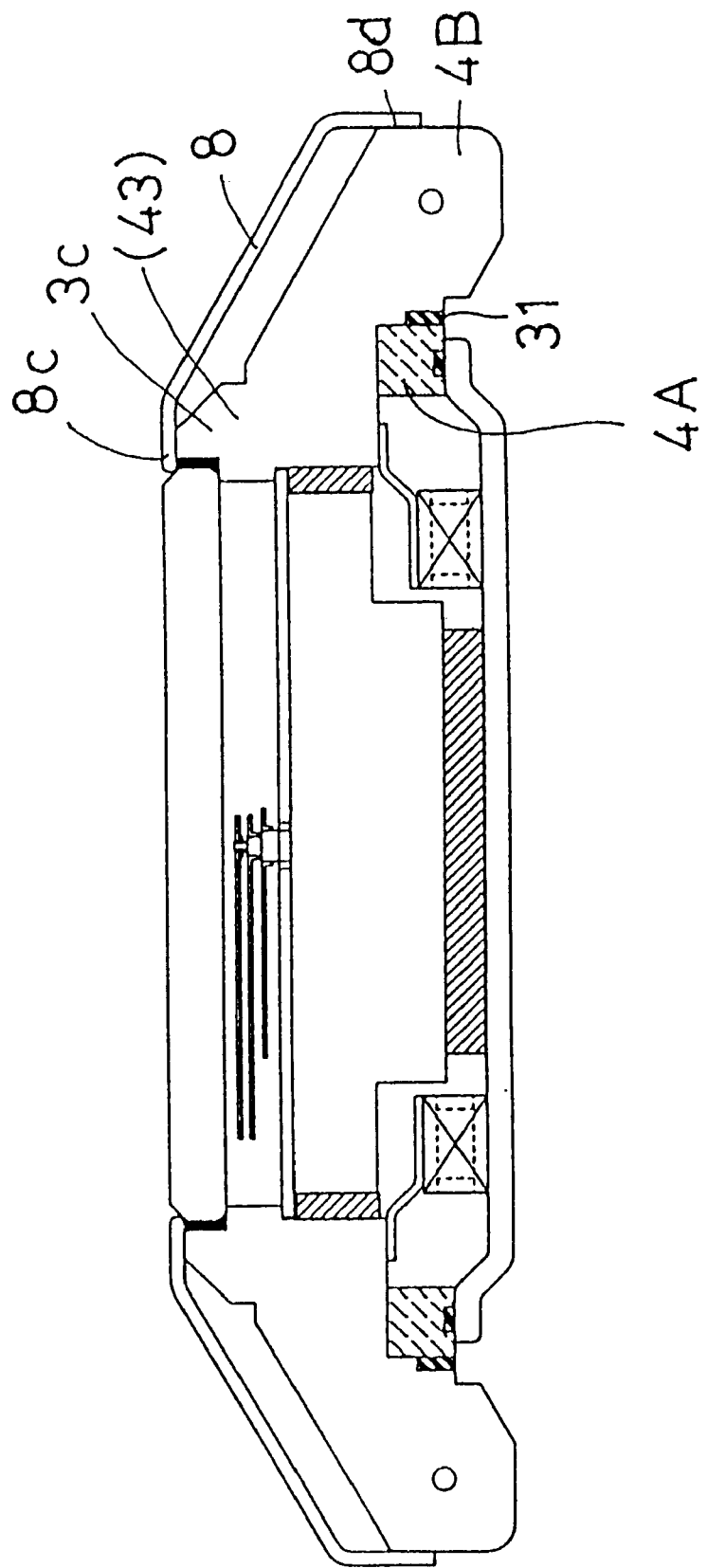

In this embodiment, the radiation outer case band 4A and the bezel 3 in the first embodiment shown in FIG. 1 are of a one-piece construction as shown in FIGS. 5(a) to (c).

In the second embodiment, a "portion equivalent to the bezel 3 of the first embodiment" will be described as a "bezel equivalent 43," and the other parts and components which are the same as those of the first embodiment are denoted by the same reference numerals, and their description will be omitted.

Therefore, the bezel equivalent 43 for fixing a glass is formed on the upper end portion of the radiation outer case band 4B as part of the case band 4B, and the glass 2 is fixed to the bezel equivalent 43.

On the other hand, on the inner circumferential side of the outer case band 4B is an extension 43a that extends towards the back cover 5. The extension 43a comes in contact with the thermoelectric generator 6.

Other than the above, the construction of the second embodiment is the same as that of the first embodiment shown in FIG. 1.

The radiation guard cover 8 in the second embodiment is the same as that of the embodiment shown in FIG. 1.

The radiation guard cover 8 is detachably attached to the wrist watch in such a manner that the lower end cylindrical portion 8d of the cover 8 is fitted around the radiation outer case band 4B or the inner case band 4A, and its inner circumferential projecting portion 8a is fitted into the cut-away portion 3a formed in the upper end of the bezel equivalent.

As shown in each of FIGS. 5(a), (b) and (c), the radiation guard cover 8 is detachably attached to the outer circumference of the radiation outer case band 4B or the inner case band 4A and to the glass fixing portion in the same way as the cover 8 of the first embodiment shown in FIGS. 1, 3 and 4.

FIG. 5(a) is an example in which the radiation outer icase band 4B and the bezel 3 shown in each of FIGS. 1 and 3 are simply formed into a one-piece structure.

FIGS. 5(b) and (c) show modified examples in which the radiation outer case band 48 and the bezel 3 of the first embodiment shown in FIG. 4 are formed into a one-piece structure, and further the way in which the radiation outer case band 4B is engaged with the inner case band 4A and the way in which a band is attached are modified from those in the first embodiment.

According to the second embodiment, the bezel and the radiation outer case band are of a monolithic construction, and hence heat transfer efficiency can be improved. On the other hand, the fabrication technology becomes more complicated, but if metal powder injection molding technology or die casting is applied, the fabrication cost can be reduced.

The present invention is not limited to the wrist watches exemplified as the aforementioned embodiments, but may be applied to electronic devices such as other types of wrist watches and pagers.

The other specifically shown detailed constructions, methods and the like can be modified within such a scope as not to depart from the spirit of the invention.

According to the present invention, the radiation section is covered with the radiation guard cover that has a plurality of radiation holes and that is made of a material having a low heat conductivity. Thus, the radiation guard cover prevents the radiation section from being touched by, e.g., a hand.

Therefore, even if a hand or the like unexpectedly touches the radiation section of a wrist-portable device, heat can be radiated from the radiation section of the thermoelectric generator, and hence power generation can be maintained.

Further, according to the present invention, if the radiation holes of the radiation guard cover are arranged effectively, the cover can radiate heat from meshes or the radiation holes, and its guard portion other than these meshes or holes can prevent a hand or the like from directly touching the radiation section. In addition, an ornamental cover can be made, depending on how the meshes or the holes are arranged.

Still further, a predetermined space is provided between the radiation guard cover and the radiation section. Thus, the transfer of heat between the radiation guard cover and the radiation section can be checked.

As a result of this construction, it is hard for heat to be transferred, thereby allowing metals such as stainless steels having relatively high heat conductivity to be used.

That is, materials such as heat insulating materials or resins which have low heat conductivity are, generally, the best materials for the guard cover. However, the synergism obtained by combining claims 3 and 4 of the present invention enables the use of metals having high mechanical strength.

Still further, the radiation guard cover is detachably fitted with the bezel and the outer case band. Thus, when the bezel and the outer case band become stained, the guard cover can be easily removed and cleaned.

Still further, the user can change the radiation guard cover with another type to his taste as a decorative accessory, and hence a new value can be added.

What is claimed is:

1. A wrist-portable device comprising: an internal device for performing a given function; a thermoelectric generator for generating electric energy for driving the internal device based on a temperature difference between a heat receiving section and a heat radiating section thereof; an inner case band having a hollow portion passing therethrough and being made of a material having a low heat conductivity; a back cover for covering a lower end side of the hollow portion of the inner case band, the back cover being disposed against a user's wrist when the wrist-portable device is worn; a transparent plate arranged on an upper end side of the hollow portion; a bezel for holding a rim of the transparent plate; a heat-radiating outer case band arranged on an upper surface of the inner case band, and being fitted with the bezel so heat can be transferred therefrom the bezel, and being made of a material having a high heat conductivity; and a radiation guard cover for covering a surface of at least one of the transparent plate, the bezel or the heat-radiating outer case band, the cover having a plurality of holes to allow heat to escape therefrom and being made of a material having a low heat conductivity.

2. A wrist-portable device according to claim 1; wherein the radiation guard cover comprises a plate having one of a mesh structure or a plurality of holes which are shaped in at least one of straight lines and curved lines to form a decorative pattern.

3. A wrist-portable device according to claim 2; wherein a total area of the meshes of the mesh structure or the plurality of holes is 50% or more of the total surface area of a radiation guard section of the radiation guard cover.

4. A wrist-portable device according to claim 2; wherein a gap is provided between the radiation guard cover and the heat-radiating outer case band to reduce heat transfer from the radiation guard cover to the heat-radiating outer case band.

5. A wrist-portable device according to claim 2; wherein the radiation guard cover is detachably fitted with an inner circumferential portion of the bezel at which the transparent plate is fitted.

6. A wrist-portable device according to claim 2; wherein the radiation guard cover is detachably fitted with one of an outer circumferential portion of the bezel, the heat-radiating outer case band or the inner case band.

7. A wrist-portable device according to claim 1; wherein a total area of the meshes of the mesh structure or the plurality of holes is 50% or more of the total surface area of a radiation guard section of the radiation guard cover.

8. A wrist-portable device according to claim 7; wherein a gap is provided between the radiation guard cover and the heat-radiating outer case band to reduce heat transfer from the radiation guard cover to the heat-radiating outer case band.

9. A wrist-portable device according to claim 7; wherein the radiation guard cover is detachably fitted with an inner circumferential portion of the bezel at which the transparent plate is fitted.

10. A wrist-portable device according to claim 7; wherein the radiation guard cover is detachably fitted with one of an outer circumferential portion of the bezel, the heat-radiating outer case band or the inner case band.

11. A wrist-portable device according to claim 1; wherein a gap is provided between the radiation guard cover and the heat-radiating outer case band to reduce heat transfer from the radiation guard cover to the heat-radiating outer case band.

12. A wrist-portable device according to claim 11; wherein the radiation guard cover is detachably fitted with an inner circumferential portion of the bezel at which the transparent plate is fitted.

13. A wrist-portable device according to claim 11; wherein the radiation guard, cover is detachably fitted with one of an outer circumferential portion of the bezel, the heat-radiating outer case band or the inner case band.

14. A wrist-portable device according to claim 1; wherein the radiation guard cover is detachably fitted with an inner circumferential portion of the bezel at which the transparent plate is fitted.

15. A wrist-portable device according to claim 1; wherein the radiation guard cover is detachably fitted with one of an outer circumferential portion of the bezel, the heat-radiating outer case band or the inner case band.

16. A wrist-portable device according to claim 1; wherein the inner case band is formed of a plastic having a heat conductivity of 1 W/(m° C.).

17. A wrist-portable device according to claim 1; wherein the inner case band is formed of one of stainless steel or titanium and has a heat conductivity of about 20 W/(m° C.).

18. A wrist-portable device according to claim 1; wherein the inner case band is formed of a metal having a heat conductivity of about 20 W/(m° C.).

19. A wrist-portable device according to claim 1; wherein the heat-radiating outer case band is formed of one of Au, Ag, Cu and Al.

20. A wrist-portable device according to claim 1; wherein the heat-radiating outer case band is formed of a material having a heat conductivity in the range of about 200 to 400 W/(m° C.).

21. A wrist-portable device according to claim 1; wherein the radiation guard cover is formed of a material having a heat conductivity of 1 W/(m° C.) or less.

22. A wrist-portable device according to claim 1; wherein the radiation guard cover is formed of a plastic.

23. A wrist-portable device according to claim 1; wherein the radiation guard cover is formed of a metal having a heat conductivity of about 20 W/(m° C.) or less.

24. A wearable electronic device comprising: a case; an internal circuit contained in the case for performing a given function; and a thermoelectric generator contained in the case and having a heat absorbing side and a heat radiating side for producing an electric power for driving the internal circuit in response to a temperature difference between the heat absorbing side and the heat radiating side; wherein the case comprises a rear cover in contact with the heat absorbing side of the thermoelectric generator, a front cover in contact with the heat radiating side of the thermoelectric generator, and a central portion in which the internal circuit and the thermoelectric generator are disposed, the front and rear covers being formed of a thermally conductive material, the central portion being formed of a thermally-insulative material for insulating the front and rear covers from each other, and the front cover having a heat-radiating portion in contact with the heat radiating side of the thermoelectric generator and a radiation guard portion formed of a thermally insulative material and having a plurality of holes through which heat radiated from the front cover may pass.

25. A wearable electronic device according to claim 24; wherein the internal circuit comprises a clock circuit.

26. A wearable electronic device according to claim 24; wherein the rear cover is configured to be disposed against a user's body when the device is worn so that heat from the user's body is communicated through the rear cover to the heat absorbing side of the thermoelectric generator.

27. A wearable electronic device according to claim 26; wherein the internal circuit comprises a clock circuit; and further comprising a time display mounted in the case and a transparent plate fitted in the front cover.

28. A wearable electronic device according to claim 27, wherein the front cover further comprises a bezel supported by the heat radiating portion of the front cover for holding the transparent plate.

* * * * *